(12) United States Patent
Bajaj et al.

(10) Patent No.: US 12,272,607 B2
(45) Date of Patent: Apr. 8, 2025

(54) METHOD OF ENHANCING CONTRAST WHILE IMAGING HIGH ASPECT RATIO STRUCTURES IN ELECTRON MICROSCOPY

(71) Applicant: Applied Materials, Inc., Santa Clara, CA (US)

(72) Inventors: Geetika Bajaj, Mumbai (IN); Prerna Sonthalia Goradia, Mumbai (IN); Robert J. Visser, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 418 days.

(21) Appl. No.: 17/770,434

(22) PCT Filed: Dec. 8, 2020

(86) PCT No.: PCT/US2020/063815
§ 371 (c)(1),
(2) Date: Apr. 20, 2022

(87) PCT Pub. No.: WO2021/141709
PCT Pub. Date: Jul. 15, 2021

(65) Prior Publication Data
US 2022/0392810 A1    Dec. 8, 2022

(30) Foreign Application Priority Data
Jan. 9, 2020   (IN) .............................. 202041000949

(51) Int. Cl.
*H01L 21/66*   (2006.01)
*B05D 1/00*    (2006.01)
(Continued)

(52) U.S. Cl.
CPC ................ *H01L 22/12* (2013.01); *B05D 1/60* (2013.01); *B82Y 40/00* (2013.01); *G01B 15/04* (2013.01)

(58) Field of Classification Search
CPC .......... B82Y 40/00; G01B 15/04; H01L 22/12
See application file for complete search history.

(56) References Cited

U.S. PATENT DOCUMENTS 9,777,025 B2   10/2017  Girard et al.
10,403,494 B2   9/2019  Girard et al.
(Continued)

FOREIGN PATENT DOCUMENTS

JP   2012132875 A   7/2012
JP   2019128282 A   8/2019
(Continued)

OTHER PUBLICATIONS

Office Action for Taiwan Application No. 109143568 dated Aug. 16, 2024.
(Continued)

*Primary Examiner* — Daniel P Shook
(74) *Attorney, Agent, or Firm* — Patterson + Sheridan, LLP

(57) ABSTRACT

The enclosed disclosure relates to a method and apparatus for depositing functionalized nanoparticles within a semiconductor structure in order to create a nano-layer capable of enhancing imaging and contrast, The semiconductor structure can include any type of VNAND structure or 3D structure, The nanoparticles are formed in high-aspect ratio trenches of the structure and form a nano-layer. The functionalized nanoparticles comprise synthesized nanoparticles as well as organic molecules. The organic molecules are chosen to selectively bind to certain nanoparticles and surface materials.

20 Claims, 8 Drawing Sheets

(51) Int. Cl.
   *B82Y 40/00*      (2011.01)
   *G01B 15/04*      (2006.01)

(56)          References Cited

U.S. PATENT DOCUMENTS 11,699,584  B2      7/2023   Girard et al.
2005/0156157  A1*     7/2005   Parsons ................ H10K 10/701
                                                       257/E23.165
2013/0099363  A1      4/2013   Chiang et al.
2015/0376211  A1     12/2015   Girard et al.
2018/0022761  A1      1/2018   Girard et al.
2019/0067014  A1      2/2019   Shrestha et al.
2019/0362961  A1     11/2019   Girard et al.
2021/0225635  A1      7/2021   Girard et al.

FOREIGN PATENT DOCUMENTS

KR      1020110060565        6/2011
   TW         201638098  A     11/2016
   TW         201920740  A      6/2019
   WO        2016160990  A1    10/2016
   WO        2016201314  A1    12/2016
   WO        2016201320  A1    12/2016

OTHER PUBLICATIONS

Search Report for Taiwan Application No. 109143568 dated Jun. 13, 2024.
International Search Report and Written Opinion dated Mar. 9, 2021 for Application No. PCT/US2020/063815.

\* cited by examiner

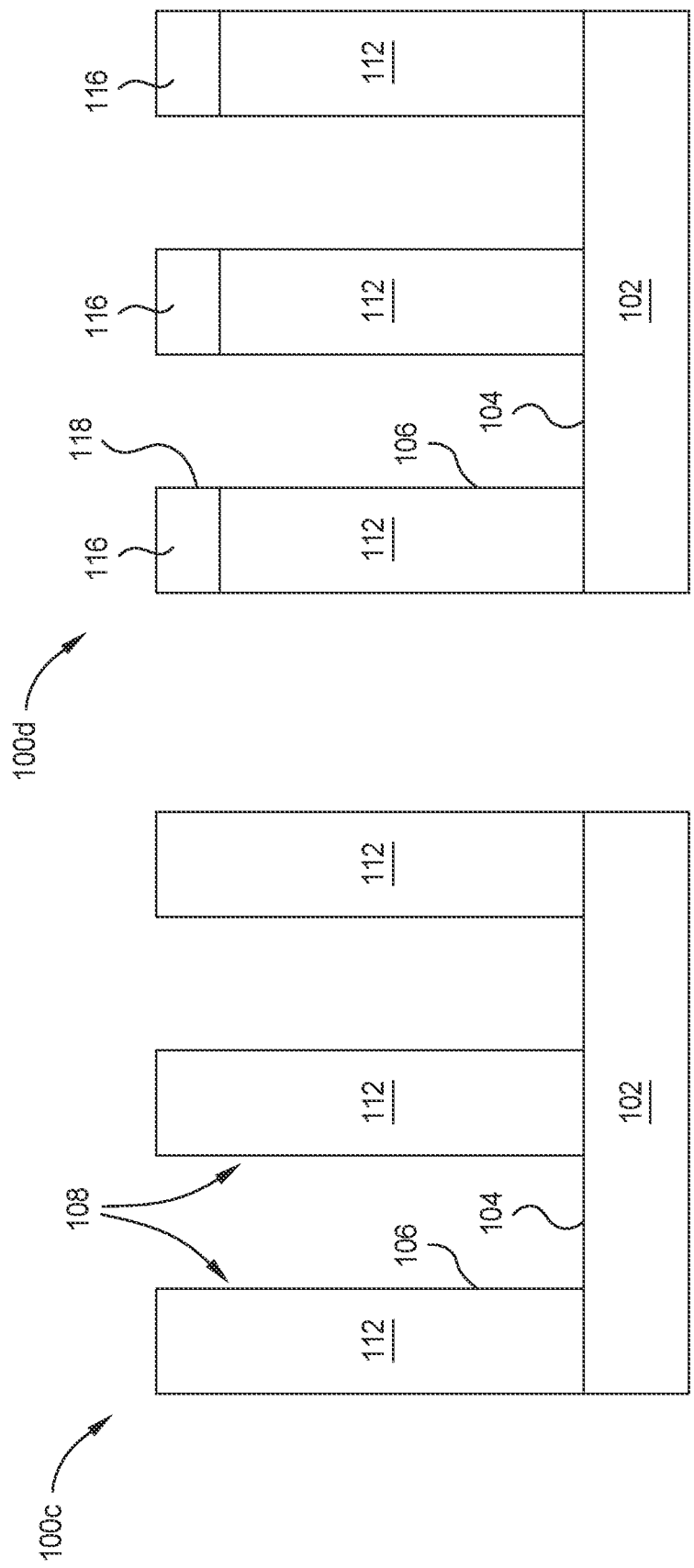

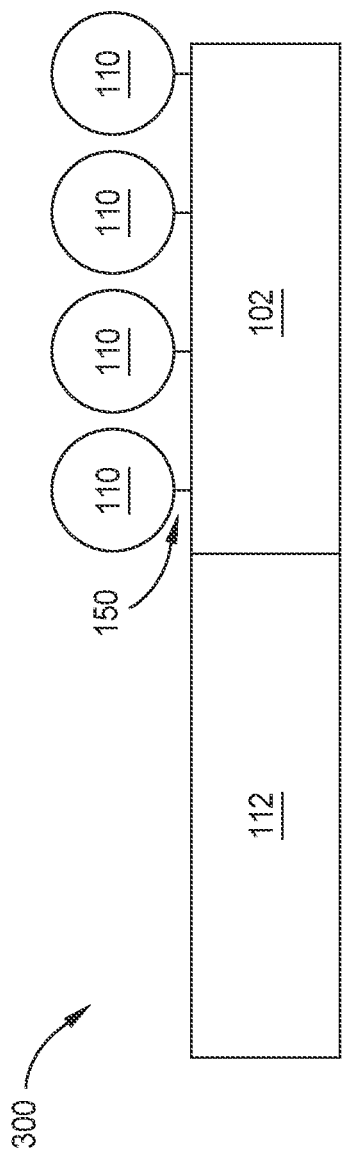
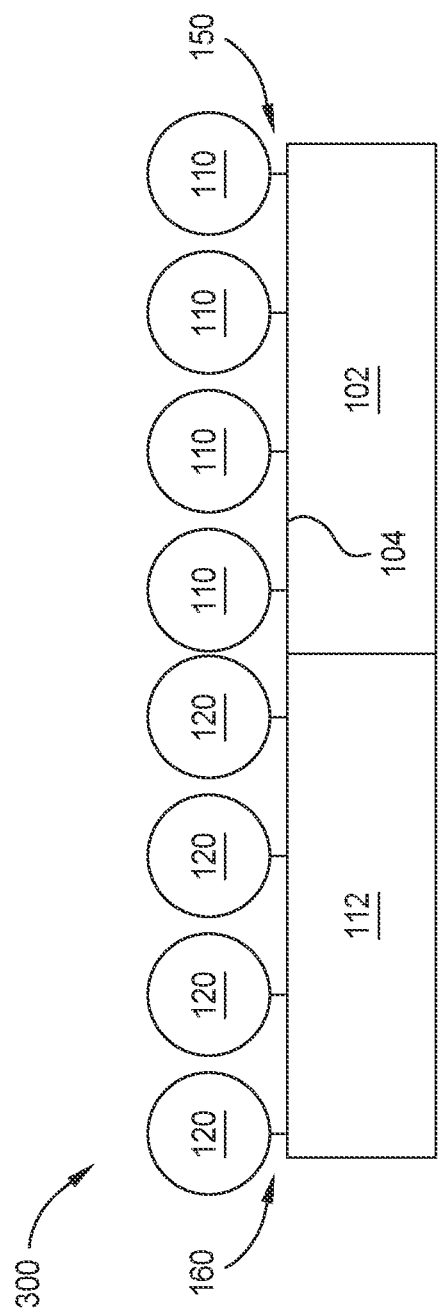
FIG. 3A
FIG. 3B

METHOD OF ENHANCING CONTRAST WHILE IMAGING HIGH ASPECT RATIO STRUCTURES IN ELECTRON MICROSCOPY

BACKGROUND

Field

Embodiments of the present disclosure generally relate to a method of immobilizing functionalized nanoparticles within a semiconductor structure in order to create a nanolayer capable of enhancing imaging and contrast.

Description of the Related Art

Imaging of substrates with high aspect ratio features thereon is currently very difficult and time consuming. Most current techniques for imaging trenches employ backscattering and electron beam usage. Many layers in a stack are made of materials, which have low atomic numbers. This makes imaging difficult as electron beams are unable to image high-aspect ratio trenches that are made up of elements with low atomic numbers. Complex VNAND and other 3D structures are difficult to image for this reason.

Thus, what is needed in the art are improved methods and apparatus for imaging of high-aspect ratio trenches in an economical and efficient manner.

SUMMARY

The present disclosure generally relate to the deposition of functionalized nanoparticles within semiconductor structures and binding those functionalized nanoparticles to the semiconductor structure.

In one embodiment, a method for depositing a layer of nanoparticles or a nano-layer to a semiconductor device is described. The method comprises modifying synthesized nanoparticles with an organic molecule. The organic molecule comprises a head group that binds to the surface of the synthesized nanoparticle and a tail group. The method additionally comprises depositing the synthesized nanoparticles onto at least part of a semiconductor structure, wherein the tail group binds the synthesized nanoparticles to at least part of the semiconductor structure.

In another embodiment, a method for depositing a nanolayer in a semiconductor device is described. The method comprises modifying synthesized nanoparticles with an organic molecule. The organic molecule comprises a head group that binds to the surface of the synthesized nanoparticle and a tail group. The method further comprises depositing the synthesized nanoparticles into at least part of a high-aspect ratio trench structure. The surface of the high-aspect ratio trench structure comprises hydrogen oxide molecules. The tail group binds the synthesized nanoparticles to at least part of the high-aspect ratio trench structure.

In another embodiment, a semiconductor device is described. The semiconductor device comprises a high-aspect ratio trench having a depth and a width. The depth to width ratio is greater than about 10:1. The semiconductor device additionally comprises a nano-layer disposed in at least a portion of the high-aspect ratio trench. The nanolayer comprises synthesized nanoparticles. The synthesized nanoparticles comprise an element with an atomic number greater than 40. The semiconductor additionally comprises an organic molecule. The organic molecule is bonded to the high-aspect ratio trench via a tail group and is bonded to the synthesized nanoparticle via a head group.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, as the disclosure may admit to other equally effective embodiments.

FIGS. 1A-1D illustrate side plan views of exemplary semiconductor structures.

FIGS. 3A-3B illustrate side close up plan views of the area around an interface between two different semiconductor materials.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to a method of depositing functionalized nanoparticles within a semiconductor structure in order to create a nanolayer capable of enhancing imaging and contrast. The semiconductor structure can include any type of VNAND structure or 3D structure. The nanoparticles are formed in high-aspect ratio trenches of the structure and form a nanolayer.

Figures 1A, 1B:
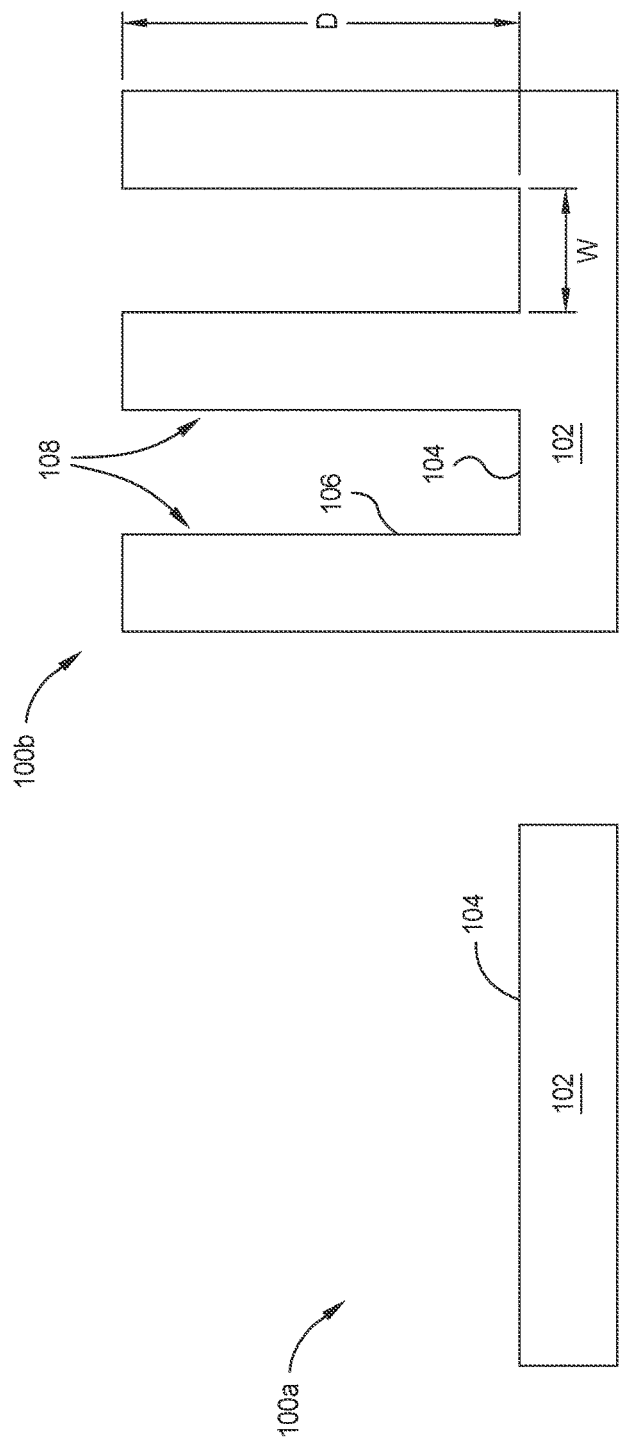

FIGS. 1A-1D illustrate side plan views of exemplary semiconductor structures. FIG. 1A illustrates a first structure 100a, which comprises a substrate 102. The substrate 102 has a substantially planar surface 104 with minimal surface roughness. Suitable materials that may be utilized for the substrate 102 include silicon or germanium. Other suitable materials for the substrate 102 include nitrides, oxides, or carbides such as silicon nitride, silicon oxide, silicon carbide, germanium nitride, germanium oxide, or germanium carbide. Additionally, it is contemplated that the substrate 102 may be a doped substrate. Suitable dopant materials include group III elements or group V elements, such as boron, arsenic, phosphorous, gallium, and combinations thereof. It is also contemplated that the substrate 102 comprises a metallic material, such as a cobalt material, a tungsten material, an aluminum material, a titanium material, a platinum material, an iridium material, or copper material. It is contemplated that the substrate 102 may also comprise other metals or metal alloys. These elements are meant to be exemplary and are not limiting in scope. Additional embodiments that are equally effective may be utilized. The substrate 102 may have a substantially planar top surface 104.

FIG. 1B illustrates a second structure 100b that includes a substrate 102 as well as device features forming high-aspect ratio trenches 108. It is contemplated that device features may be formed from the same materials as the substrate 102 described above. It is also contemplated that the substrate 102 and device features form a continuous structure. The continuous structure can be with or without a boundary layer. The high-aspect ratio trenches 108 are bound by vertical sidewalls 106 and the top surface 104 of the substrate 102. The high-aspect ratio trenches 108 have a depth (D) and a width (W). The depth is defined as the distance from the bottom of the high-aspect ratio trenches 108 to the top of the high-aspect ratio trenches 108. The depth (D) can be seen in FIG. 1B as being the same as the length of the vertical sidewalls 106. The width is defined as the distance from one vertical sidewall of the trench to the immediate opposite vertical sidewall 106 of that same trench. The two sidewalls defining the width are parallel to each other.

The depth to width ratio is generally greater than about 10:1, such as greater than about 15:1, or greater than about 20:1. The width of the high-aspect ratio trenches 108 may be less than about 500 nm, such as less than about 350 nm, less than about 200 nm, less than 100 nm, or less than 50 nm. A width of the high aspect ratio trenches may be between about 15 nm and about 35 nm. A depth of the high aspect ratio trenches may be less than 5000 nm, such as less than about 2500 nm, less than about 1000 nm, or less than 500 nm. In some embodiments, the depth of the high aspect ratio trenches may be between about 150 nm and about 225 nm.

FIG. 1C illustrates a third structure 100c, which has a similar structure to the second structure 100b of FIG. 1B. The difference between the second structure 100b and the third structure 100c is that the vertical sidewalls 106 of the high-aspect ratio trenches 108 of the third structure 100c are formed from a second material. The second material is a different material than the first material utilized in the vertical sidewalls 106 of the high-aspect ratio trenches 108 of the second structure 100b. This is seen in FIG. 1C as the second material disposed on the substrate 102 forms vertical columns 112, which include the vertical sidewalls 106 of the high-aspect ratio trenches 108. The vertical columns are disposed on and in contact with the substrate and are formed approximately normal to a top plane of the substrate. The second material can be made of any of the same materials capable of being utilized to form the substrate 102, but is a different material than the substrate 102. The second material can additionally be made of silicon, silicon oxides, silicon nitrides, silicon oxynitrides. In some embodiments, the second material can additionally be any low-k dielectric material, silicon-based material, or dielectric. In some embodiments the second material is an epitaxial silicon material. The depth and width of the high-aspect ratio trenches 108 formed by the second material and the vertical columns 112 can be defined in a similar fashion to the depth and width of the high-aspect ratio trenches 108 formed in the second structure 100b by the vertical sidewalls 106 and the horizontal bottom surfaces 104. In one embodiment, the material at the bottom of the trench formed from the substrate 102 and the horizontal bottom surface 104 is a metallic material. In other embodiments, the material at the bottom of the trench is a silicon nitride containing material or a silicon oxide containing material. The vertical sidewalls of the trench could be an oxide-polysilicon-oxide-polysilicon (OPOP) stack or an oxide-nitride-oxide-nitride (ONON) stack.

FIG. 1D illustrates a fourth structure 100d, which is similar to the third structure 100c of FIG. 1C. The fourth structure 100d is different from the third structure 100c in that there are caps 116 over the vertical columns 112, such that the caps 116 form an extension of the vertical columns 112. The caps 116 include second vertical sidewalls 118, which are in the same plane as the vertical sidewalls 106 formed by the vertical columns 112. The caps 116 may be a different material than both the substrate 102 and the vertical columns 112. Alternatively, the caps 116 may be a different material than the vertical columns 112, but the same material as the substrate 102. The caps 116 comprise a third material, which can be any one of the materials capable of being included within the substrate 102, as mentioned above. The cap 116 may comprise any patterning material or hard mask material used in conventional substrate processing methods. In some embodiments, the cap 116 may comprise one or more of silicon, aluminum, copper, silicon nitride, or silicon dioxide. The cap 116 may be disposed above the vertical columns 112, such that the cap 116 is in contact with the vertical columns 112. The cap 116 may increase the depth of the high-aspect ratio trenches 108. Alternatively, the vertical columns 112 may have been etched before depositing the caps 116, so that the high-aspect ratio trenches 108 have the same depth as the high-aspect ratio trenches 108 of the third structure 100c.

In the embodiment where the cap 116 is deposited over the vertical columns 112, the cap 116 may extend the depth of the high-aspect ratio trench 108. The depth of the high-aspect ratio trenches 108 may be extended by the vertical length of the second vertical sidewalls 118. This would cause the depth to be equal to the sum of the length of the vertical sidewalls 106 and the second vertical sidewalls 118. The width of the high-aspect ratio trenches 108 would be equal to the distance from one vertical sidewall 106 to an opposite and parallel vertical sidewall 106. This distance may also be the length of the horizontal bottom surface 104 of the trench.

Other exemplary embodiments include where the substrate 102 includes multiple layers. These layers may be stacked in, such that the layers form sheets parallel to each other. In another alternative embodiment, the trenches can be slanted, such that the vertical sidewalls are at an angle other than 90 degrees to the top surface of the substrate 102. The structures 100a-100d may additionally include additional elements to the structure, such as different layers within vertical columns.

Figure 2B:
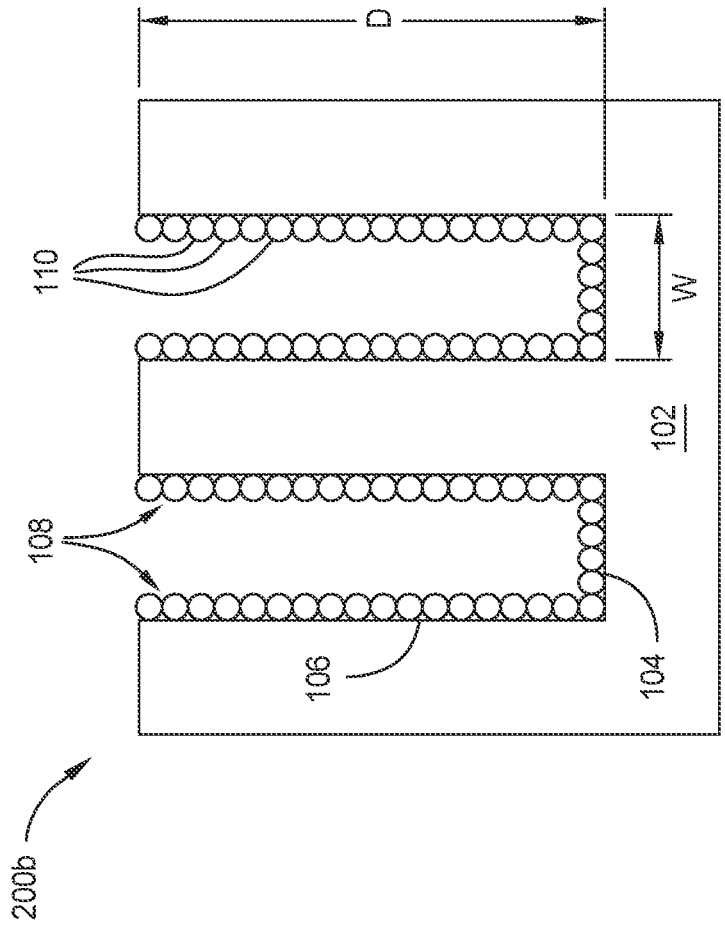
FIGS. 2A-2D illustrate side plan views of the exemplary structures of FIGS. 1A-1D after the deposition and binding of nanoparticles to the exemplary structures.
Figure 2A:
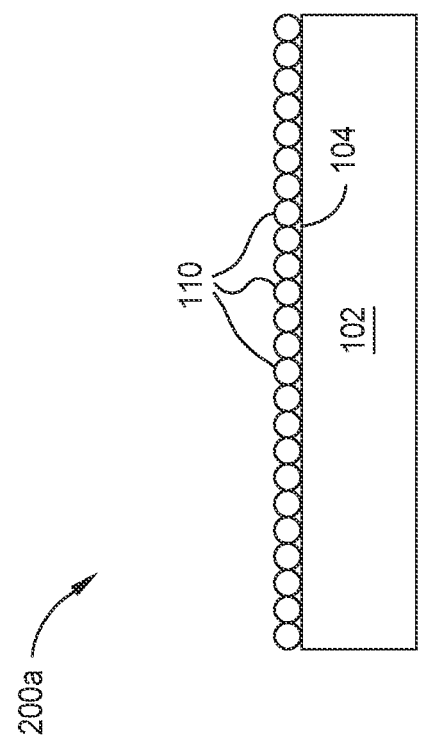

FIGS. 2A-2D illustrate side plan views of the exemplary structures of FIGS. 1A-1D after the deposition and binding of nanoparticles to the exemplary structures. FIG. 2A illustrates the first structure 100a of FIG. 1A, but includes a layer of synthesized nanoparticles 110 that have been immobilized onto the substrate 102. The first structure 100a with the nanoparticles 110 is labeled 200a. The nanoparticles 110 are bonded to the top surface 104 of the substrate 102 and form imaging markers. The deposited nanoparticles 110 may form a uniform layer. The uniform layer may be one molecule thick, such that the thickness of the uniform layer is substantially equal to the diameter of the nanoparticles 110. The uniform layer may be described as a nano-layer, a nanoparticle layer, or a marker layer. This nano-layer may be less than about 10 nm thick, such as less than about 5 nm thick, such as about 2 nm thick. The combination of the first structure 100a and the nano-layer of nanoparticles 110 comprises a first marked structure 200a. It should be noted that the substrate 102 material does not require a specific nanoparticle to be used. Any nanoparticle may be used for any substrate 102 material as long as a molecule string is selected to bind to both the nanoparticle material and the substrate 102 material.

FIG. 2B illustrates the second structure 100b of FIG. 1B, but includes a layer of synthesized nanoparticles 110 that have been deposited onto the substrate 102 and inside of the high-aspect ratio trenches 108. The second structure 100b with the nanoparticles 110 is a second marked structure 200b. The synthesized nanoparticles 110 are bonded to the bottom surface 104 and the vertical sidewalls 106 of the high-aspect ratio trenches 108. The bonded synthesized nanoparticles 110 form imaging markers on the surface of the high-aspect ratio trenches 108. Similar to the layer of synthesized nanoparticles 110 in FIG. 2A, the synthesized nanoparticles 110 bonded to the inside surface of the high-aspect ratio trenches 108 form a nano-layer that has a substantially uniform thickness on all surfaces of the inside of the high-aspect ratio trenches 108. The nano-layer may be only one molecule thick. In some embodiments the nano-layer may be less than about 10 nm thick, such as less than about 5 nm thick, such as about 2 nm thick. The combination of the second structure 100b and the nano-layer of nanoparticles 110 comprises the second marked structure 200b.

Figure 2D:
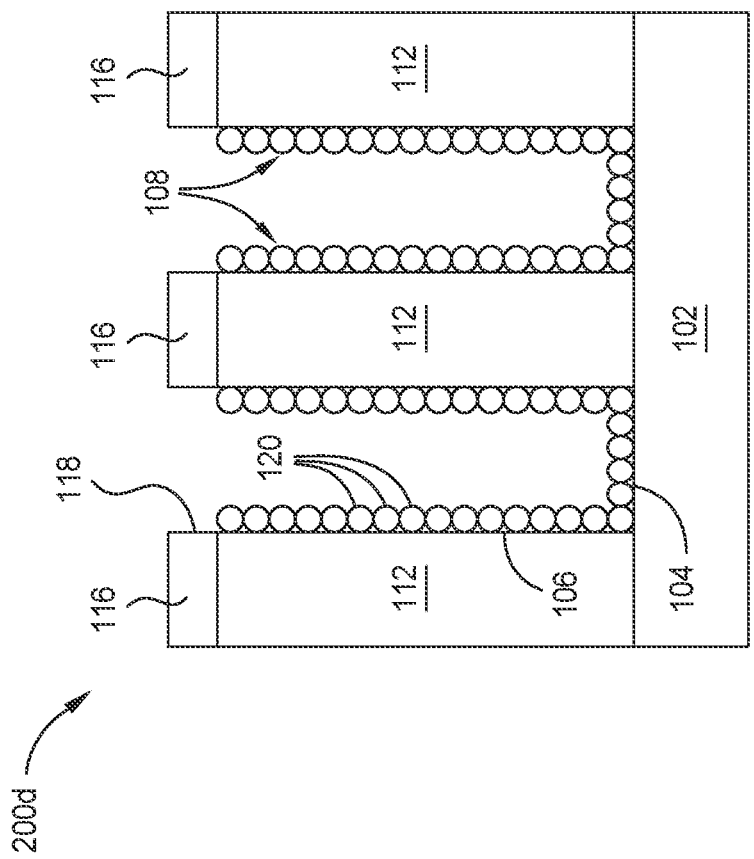
Figure 2C:
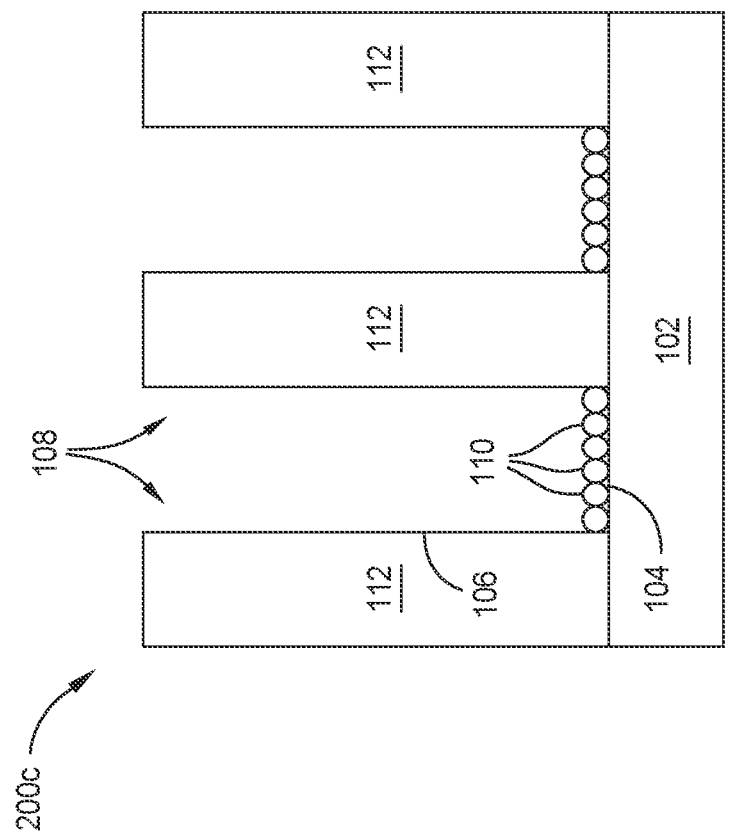

FIG. 2C illustrates the third structure 100c of FIG. 1C, but includes a layer of synthesized nanoparticles 110 that have been deposited onto the substrate 102 and inside of the high-aspect ratio trenches 108. The third structure 100c with the nanoparticles 110 is a third marked structure 200c. The synthesized nanoparticles 110 are selectively bonded to only the bottom surface 104 of the high-aspect ratio trenches 108. The synthesized nanoparticles 110 are adverse to bonding with the materials of the vertical sidewalls 106.

The bonded synthesized nanoparticles 110 form imaging markers on the bottom surface 104 of the high-aspect ratio trenches 108. Similar to the layer of synthesized nanoparticles 110 in FIG. 2A and FIG. 2B, the synthesized nanoparticles 110 bonded to the bottom inside surface of the high-aspect ratio trenches 108 form a nano-layer that has a substantially uniform thickness on the bottom surface 104. The nano-layer may be only one molecule thick. In some embodiments the nano-layer may be less than about 10 nm thick, such as less than about 5 nm thick, such as about 2 nm thick. The combination of the third structure 100c and the nano-layer of nanoparticles 110 comprises the third marked structure 200c.

In some embodiments, the synthesized nanoparticles are selectively bonded to the vertical sidewalls 106. Depositing and bonding the synthesized nanoparticles 110 such that the synthesized nanoparticles 110 are selectively bonded to the vertical sidewalls 106 can be done as an alternative to selectively bonding the synthesized nanoparticles 110 to the bottom surface 104.

FIG. 2D illustrates the fourth structure 100d of FIG. 1D, but includes a layer of secondary synthesized nanoparticles 120 that have been deposited inside of the high-aspect ratio trenches 108. The fourth structure 100d with the nanoparticles 110 is a fourth marked structure 200d. The secondary synthesized nanoparticles 120 are bonded to the vertical sidewalls 106 of the high-aspect ratio trenches 108. The secondary synthesized nanoparticles 120 are selectively deposited onto the vertical sidewalls 106 of the high-aspect ratio trenches 108. The bonding is done, such that the secondary synthesized nanoparticles 120 are bonded only to the vertical sidewalls 106. The secondary synthesized nanoparticles 120 are made such that the secondary synthesized nanoparticles 120 are adverse to bonding to other materials that are not the vertical sidewalls 106. The secondary synthesized nanoparticles 120 are different from the synthesized nanoparticles 110 in that they have different bonding properties. These bonding properties are caused by natural chemical bonding affinities of organic molecules that are used to functionalize the synthesized nanoparticles 110 and the secondary synthesized nanoparticles 120.

The bonded secondary synthesized nanoparticles 120 form imaging markers on the surface of the high-aspect ratio trenches 108. Similar to the layer of synthesized nanoparticles 110 in FIG. 2A, FIG. 2B, and FIG. 2C, the secondary synthesized nanoparticles 120 bonded to the inside surface of the high-aspect ratio trenches 108 form a nano-layer that has a substantially uniform thickness on all surfaces of the inside of the high-aspect ratio trenches 108. The nano-layer may be only one molecule thick. In some embodiments the nano-layer may be less than about 10 nm thick, such as less than about 5 nm thick, such as about 2 nm thick. The combination of the fourth structure 100d and the nano-layer of nanoparticles 110 comprises the fourth marked structure 200d.

In a similar embodiment, the synthesized nanoparticles 110 can be functionalized to bond to either the second vertical sidewalls 118 of the cap 116, or the synthesized nanoparticles are functionalized to bond to the bottom surface 104.

FIGS. 3A-3B illustrate side close up plan views of the area around an interface between two different semiconductor materials. Both FIG. 3A and FIG. 3B illustrate potential embodiments in which the synthesized nanoparticles 110 or secondary synthesized nanoparticles 120 are functionalized with organic molecules. This functionalization enables the synthesized nanoparticles 110 and secondary synthesized nanoparticles 120 to be selectively bonded to surfaces such as material similar to substrate 102 or material similar to the vertical columns 112.

FIG. 3A illustrates an interface 300 between the substrate 102 and vertical columns 112 of the high-aspect ratio trenches 108 in FIGS. 2C and 2D. The interface 300 shown in FIG. 3A includes synthesized nanoparticles 110, which are functionalized to bond to the material of the substrate 102. The synthesized nanoparticles 110 are bonded using organic molecules 150. The organic molecules bond the synthesized nanoparticle to the material of the substrate 102. This bonding is done selectively, such that the synthesized nanoparticles 110 are adverse to bonding to the material of the vertical columns 112 of the high-aspect ratio trenches 108. This allows for the synthesized nanoparticles 110 to be bonded to one type of material, but not another. In this embodiment, it is shown that the synthesized nanoparticles are bonded to the material of the substrate 102, but not the material of the vertical columns 112 of the high-aspect ratio trenches 108.

FIG. 3B illustrates another embodiment of the interface 300 between the substrate 102 and vertical columns 112 of the high-aspect ratio trenches 108 in FIGS. 2C and 2D. The interface 300 shown in FIG. 3B includes synthesized nanoparticles 110, which are functionalized to bond to the material of the substrate 102, and secondary synthesized nanoparticles 120, which are functionalized to bond to the material of the vertical columns 112 of the high-aspect ratio trenches 108. The synthesized nanoparticles 110 are bonded to the material of the substrate 102 through organic molecules 150 as described when discussing FIG. 3A. The secondary synthesized nanoparticles 120 are bonded to the material of the vertical columns 112 through secondary organic molecules 160. The secondary organic molecules 160 may be similar to the organic molecules 150, except that the secondary organic molecules 160 functionalize the secondary synthesized nanoparticles 120 to selectively bind to the material of the vertical columns 112. In a similar embodiment, the secondary synthesized nanoparticles 120 are an entirely different nanoparticle material from the synthesized nanoparticles 110. The synthesized nanoparticles 110 and the secondary synthesized nanoparticles 120 are able to be different nanoparticle materials and functionalized with different organic molecules 150 and 160. Different nanoparticle materials may be chosen depending upon the desired characteristics. The organic molecules 150 and 160 are chosen to selectively bind to the nanoparticle materials as well as certain surface materials.

In some embodiments, the surface for which it is desired to bind the synthesized nanoparticles may comprise hydrogen oxide (—OH) molecules along the surface. This may be caused by a previous treatment, or may occur naturally for a given material. The presence of the hydrogen oxide may allow some functionalized groups to bind to the surface.

Figure 4:
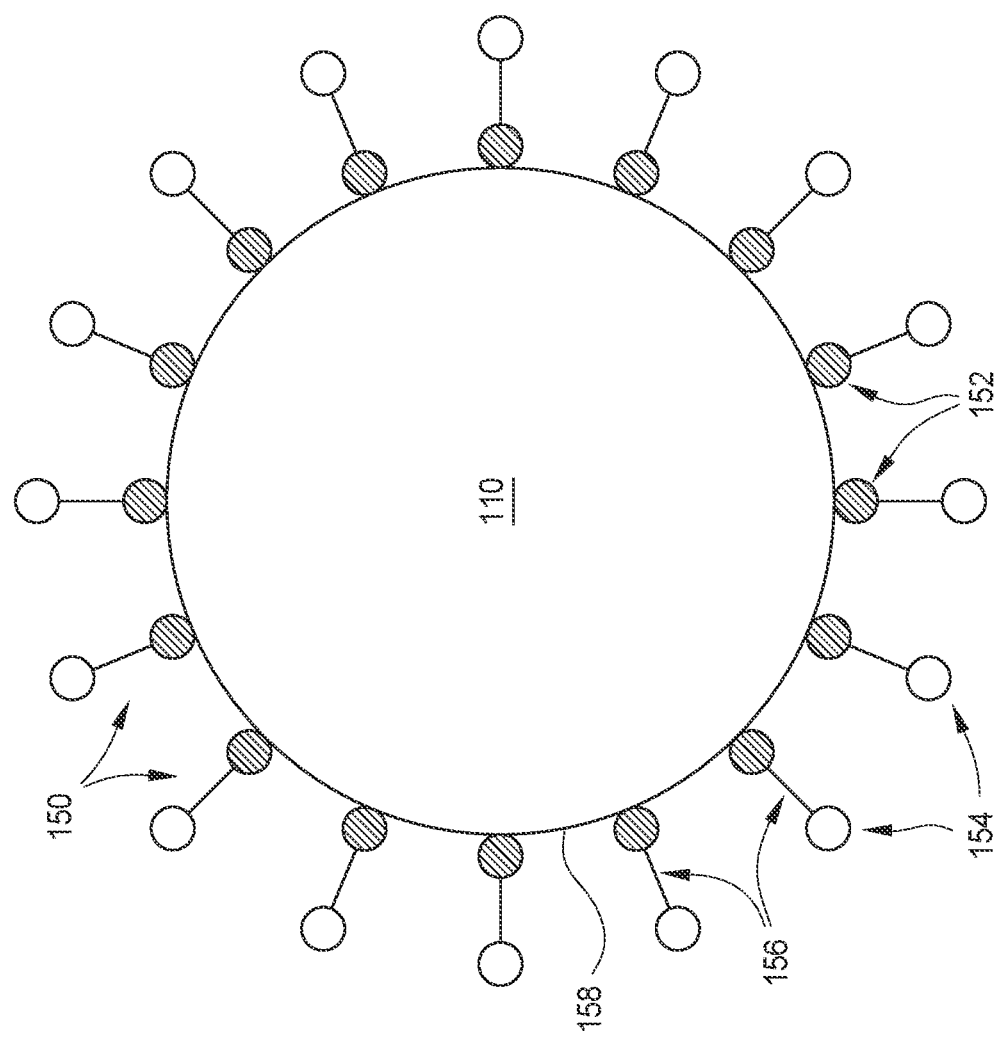
FIG. 4 illustrates a schematic diagram of an exemplary functionalized nanoparticle.

FIG. 4 illustrates a schematic diagram of an exemplary functionalized nanoparticle. The exemplary functionalized nanoparticle is made up of the synthesized nanoparticle 110 and organic molecules 150. The organic molecules 150 include a head group 152, a thread group 156, and a tail group 154. The head group 152 is bonded to the surface 158 of the synthesized nanoparticle 110. When initially functionalized, the tail group 154 of the organic molecule 150 is free and does not bond to a surface. Upon contact with certain surfaces, such as the surface of the substrate 102, the tail group 154 of the organic molecule 150 binds to the surface. The thread group connects the head to the tail, such that the thread group is connected on one end with the tail group and on the other end with the head group.

The head group can comprise any one of SH, $NH_2$, $PO(OH)_2$, $SiCl_3$, and COOH. The thread group can comprise any one of $(CH_2)_3$, $(CH_2)_{11}$, $C_6H_5$, $(CH_2)_2$, $(CH_2)_{15}$, $(CH_2)_{17}$, and $CH_3(CH_2)_{13}$. The tail group can comprise any one of $Si(OCH_3)_3$, $Si(OC_2H_5)_3$, COOH, and $CH_3$. While the above are examples of molecules which could make up the head group, thread group, and tail group of the organic molecules, other equally effective molecules may be utilized.

The synthesized nanoparticle may be primarily comprised of one of gold, silver, or copper. Additionally, the synthesized nanoparticle may be made of any metal or non-metal with an atomic number of greater than 25, such as elements with an atomic number greater than 30, such as elements with an atomic number greater than 40, such as elements with an atomic number greater than 45. The synthesized nanoparticles may additionally comprise at least one florescent marker. These florescent markers are commercially available and can be modified in a similar fashion to the synthesized nanoparticles in order to bind to a desired surface of a material.

The synthesized nanoparticle 110 is generally known to be smaller than the width of a high-aspect ratio trench. The diameter of the synthesized nanoparticle 110 may be less than about 25 nm, such as less than about 15 nm, such as less than 10 nm, such as less than 5 nm, such as less than about 3 nm, such as less than about 2 nm. In some embodiments the nanoparticle 110 is between about 1 nm and about 5 nm in diameter.

In an exemplary embodiment, the synthesized nanoparticle 110 comprises a gold nanoparticle that has been previously formed and treated. The synthesized nanoparticle 110 can be a gold nanoparticle with citrate acting as a capping agent. The gold nanoparticle may have been synthesized using Turkevich's citrate reduction method. The citrate is subsequently removed from the surface of the synthesized nanoparticle 110 with the addition of an organic molecule such as a thiol.

TABLE 1

Exemplary Head, Thread, and Tail groups

|  | Head Group | Thread Group | Tail Group |
| --- | --- | --- | --- |
| Example 1 | —SH | $(CH_2)_3$ | —$Si(OCH_3)_3$ |
| Example 2 | —SH | $(CH_2)_{11}$ | —$Si(OCH_3)_3$ |
| Example 3 | —$NH_2$ | $(CH_2)_3$ | —$Si(OC_2H_5)_3$ |
| Example 4 | —$NH_2$ | $C_6H_5$ | —$Si(OCH_3)_3$ |
| Example 5 | —$NH_2$ | $(CH_2)_3$ | —$Si(OC_2H_5)_3$ |
| Example 6 | —SH | $(CH_2)_2$ | —COOH |
| Example 7 | —SH | $(CH_2)_{10}$ | —COOH |
| Example 8 | —SH | $(CH_2)_{11}$ | —$CH_3$ |
| Example 9 | —SH | $(CH_2)_{15}$ | —$CH_3$ |
| Example 10 | —SH | $(CH_2)_{17}$ | —$CH_3$ |
| Example 11 | —$PO(OH)_2$ | $(CH_2)_{17}$ | —$CH_3$ |
| Example 12 | —$SiCl_3$ | $(CH_2)_{17}$ | —$CH_3$ |
| Example 13 | —COOH | $CH_3(CH_2)_{13}$ | —$CH_3$ |

Exemplary embodiments of head groups 152, thread groups 156, and tail groups 154 that are compatible are given in the Table 1 above.

Figure 5:
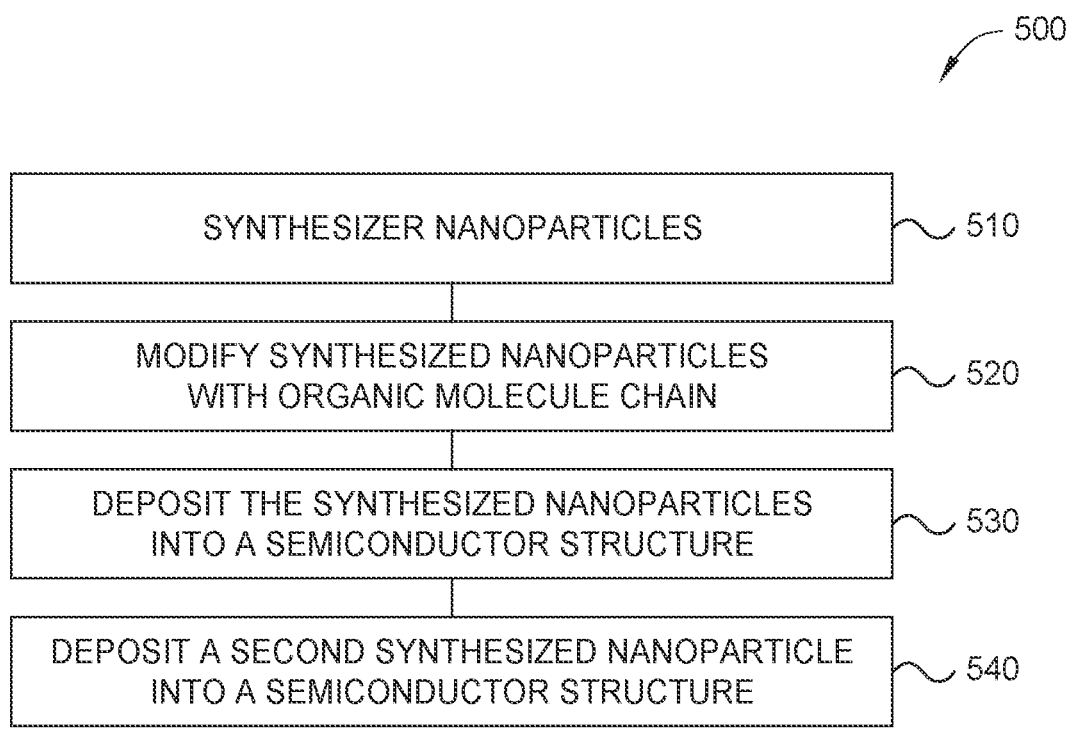
FIG. 5 is a block diagram of a method of depositing synthesized nanoparticles within a semiconductor structure.

FIG. 5 is a block diagram of a method 500 of depositing synthesized nanoparticles within a semiconductor structure. The method includes synthesizing the nanoparticles in a first operation 510, modifying the synthesized nanoparticles with an organic molecule chain in a second operation 520, depositing the synthesized nanoparticles into a semiconductor structure in a third operation 530, and an optional fourth operation 540 of depositing a second synthesized nanoparticle into a semiconductor structure.

The first operation 510 of synthesizing the nanoparticle varies greatly depending upon the material utilized. In this operation, the synthesized nanoparticles are equivalent to the synthesized nanoparticles 110 shown in FIGS. 2A-2C, 3A, 3B, 4 and 6B. In some embodiments, a gold nanoparticle is synthesized. Synthesizing the gold nanoparticle may include reducing chloroauric acid with trisodium citrate to form a reduced gold nanoparticle. Citrate ions in this embodiment act as a reducing and capping agent. The diameter of the nanoparticle may be controlled by the molar ratio of citrate to gold. A higher citrate to gold ratio will yield smaller nanoparticles. These nanoparticles are the synthesized nanoparticles discussed previously in the application.

Other equally effective ways of synthesizing nanoparticles may be utilized. The synthesized nanoparticles may additionally be nanoparticles made from other materials comprising elements with a high atomic number. This includes elements with an atomic number greater than 25, such as elements with an atomic number greater than 30, such as elements with an atomic number greater than 40, such as elements with an atomic number greater than 45. Some examples of elements that may be utilized as nanoparticles and then synthesized include silver, copper, and platinum. These nanoparticles may be functionalized in a similar fashion to the gold nanoparticles.

Fluorescent markers may also be utilized as synthesized nanoparticles. When utilizing the fluorescent markers, the nanoparticles may need to be synthesized, or may be purchased as already synthesized. Some exemplary embodiments of fluorescent markers that can be utilized include markers containing aromatic organics and silane groups for binding.

The second operation 520, includes modifying the synthesized nanoparticles with organic molecule chains. Exemplary molecule chains that can be used are discussed in Table 1. When using synthesized gold particles, modifying the synthesized nanoparticles with organic molecule chains may comprise removing citrate from the surface of the gold nanoparticle with the addition of thiols. The thiol is the head group of an organic molecule chain. The makeup of the rest of the molecule chain depends upon the desired material for which to bind the synthesized nanoparticles. When utilizing an —OH terminated surface, the tail group may include (3-Mercaptopropyl)trimethoxysilane. The thread group for the thiol head group and (3-Mercaptopropyl)trimethoxysilane tail group may be a dimethylene thread group or some other combination of a methylene thread group.

The present disclosure does not limit to the modification of gold nanoparticles with organic molecules. Any synthesized nanoparticle previously mentioned may be modified with an organic molecule. The organic molecule may be chosen to selectively bind to the surface of the synthesized nanoparticle, as well as the surface of a desired semiconductor material. In one embodiment, the organic molecule can be chosen so that the head group binds to a copper or silver synthesized nanoparticle. The tail group may be chosen such that the tail group can bind to either a silicon surface, a silicon oxide surface, a silicon nitride surface, or any other surface within a semiconductor device. While Table 1 illustrates some examples of different organic molecule groups that could be utilized together, it is recognized that Table 1 is not an exhaustive list and that many other groups of head, thread, and tail groups may be utilized in order to functionalize different synthesized nanoparticles for different purposed.

The third operation 530, includes depositing the synthesized nanoparticles into a semiconductor structure. Depositing the synthesized nanoparticles is completed after the modification of the nanoparticles so that the nanoparticles are modified with an organic molecule. The deposition of the synthesized nanoparticles can be done by any reasonable means. This includes the utilization of thin-film deposition methods such as chemical vapor deposition processes. In an equally effective embodiment, the semiconductor structure can be dipped into a bath wherein the synthesized nanoparticles are suspended. In some embodiments of the present disclosure, the deposition of synthesized nanoparticles may include dip coating or spin coating. Dip coating may comprise immersing the semiconductor structure in a solution of the coating material, holding the semiconductor structure within the solution for a predetermined time period, withdrawing the semiconductor structure from the solution, draining excess solution from the semiconductor structure, and evaporating the remaining solvent from the semiconductor structure. Spin coating may include applying a synthesized nanoparticle solution to the center of the semiconductor structure and subsequently spinning the semiconductor structure at a high speed in order to spread the coating material by centrifugal force. The synthesized nanoparticles deposit into at least part of the structure. This includes the deposition of the synthesized nanoparticles into high-aspect ratio trenches. The synthesized nanoparticles may deposit onto at least one surface within the high-aspect ratio trenches. This may include depositing onto a first surface made of a first material, a second surface made of a second material, or a third surface made of a third material. In some embodiments, the synthesized nanoparticles may deposit onto and bind to more than one surface, such as the first surface and the second surface, such as the first surface and the third surface, or such as the second surface and the third surface. The synthesized nanoparticles may have been optimized to bind to a particular material in the high-aspect ratio trench to form a nano-layer. For example, the nano-layer may be optimized to bind to a nitride layer of an ONON stack or an oxide layer of an OPOP stack.

Figures 6A, 6B:
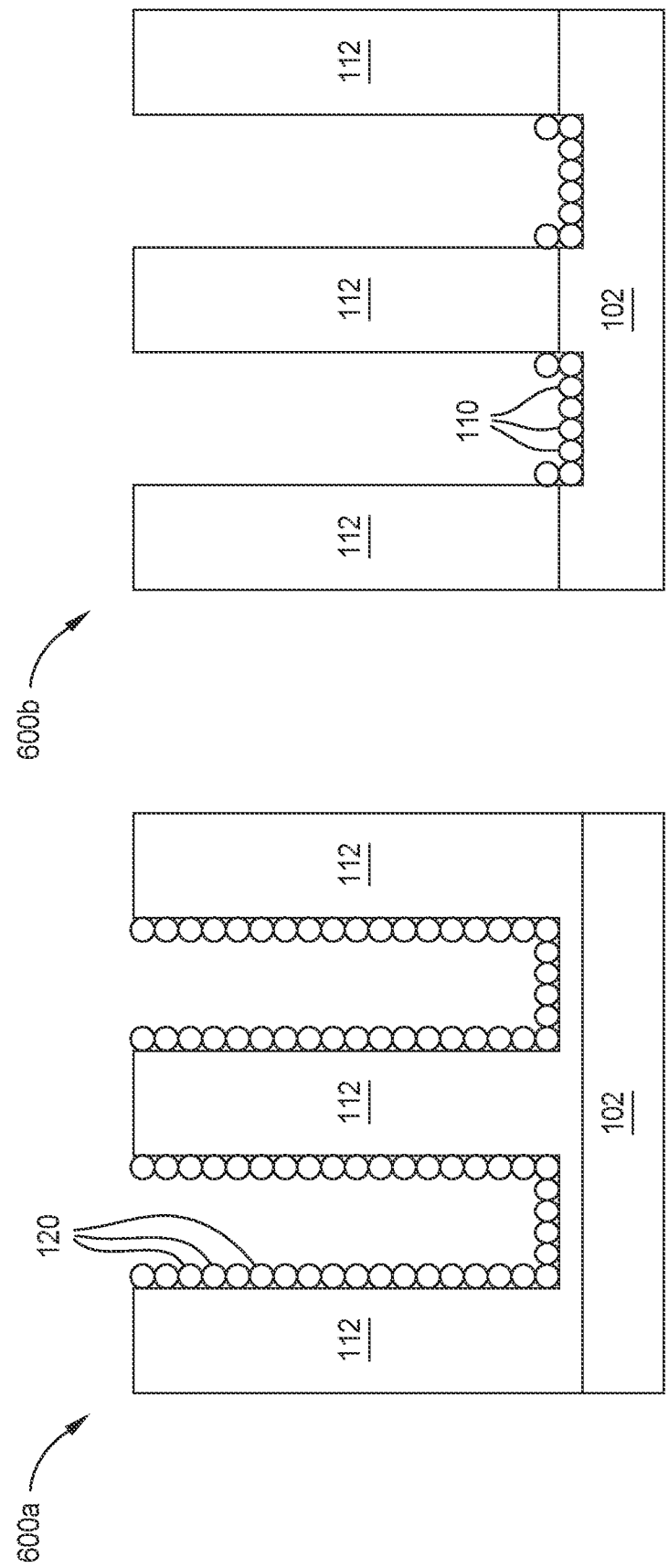
FIGS. 6A and 6B illustrate side plan views of semiconductor structures in which there is over or under etching.

The fourth operation 540, includes depositing a second set of synthesized nanoparticles into a semiconductor structure. The second set of synthesized nanoparticles is represented in FIGS. 2D, 3B, and 6A as secondary synthesized nanoparticles 120. These secondary synthesized nanoparticles may be similar to the first set of synthesized nanoparticles as described in operations 510, 520 and 530. In another embodiment, the second set of synthesized nanoparticles may be a different type of synthesized nanoparticles from the first set of synthesized nanoparticles. The second set of synthesized nanoparticles may be modified such that they deposit on a surface that is different from the surface for which the first set of synthesized nanoparticles was deposited and bonded. The second set of synthesized nanoparticles may include a synthesized nanoparticle made from a different material or may include a synthesized nanoparticle made from the same material. The secondary synthesized nanoparticle may additionally have a different organic molecule that is bonded to the surface of the synthesized molecule. The different organic molecule may have a different tail group that binds to different surfaces than the organic molecule bonded to the first set of synthesized nanoparticles. This is beneficial in that the secondary synthesized nanoparticles do not generally bind to the same semiconductor materials as the first synthesized nanoparticles. Both the first synthesized nanoparticles and the secondary synthesized nanoparticles bind to different materials and are averse to binding to materials other than for those which they have been selectively designed.

FIGS. 6A and 6B illustrate side plan views of semiconductor structures in which there is over or under etching. FIG. 6A illustrates a semiconductor structure, which has been under etched. FIG. 6B illustrates a semiconductor structure, which has been over etched. The deposition of the synthesized nanoparticles 110 and 120 enable for improved imaging and faster scan of a substrate for improper etching/deposition.

FIG. 6A illustrates an exemplary semiconductor high-aspect ratio trench structure, which has been under etched in a previous process. This exemplary semiconductor structure is an under etched trench structure 600a. This under etched trench structure 600a is known to be under etched by the presence of a strip of a second material that is the same material used to form the vertical columns 112 of the high-aspect ratio trenches. This strip of second material is shown disposed between the bottom of the high-aspect ratio trenches and the top surface of the substrate 102. The top surface of the substrate 102 is shown to be at least partially covered by the second material. In the embodiment shown in FIG. 6A, the top surface of the substrate 102 is shown to be completely covered by the second material, such that no portion of the upper surface of the substrate is exposed to the atmosphere. Disposed within the high-aspect ratio trenches of the under etched trench structure 600a are secondary synthesized nanoparticles 120. These secondary synthesized nanoparticles 120 are similar to the secondary synthesized nanoparticles 120 described in FIGS. 2D and 3B. These synthesized nanoparticles are bonded to the second material that is meant to make up the vertical columns 112 of the high-aspect ratio trenches using an organic molecule. FIG. 6A illustrates the ability of the secondary synthesized nanoparticles 120 to selectively bond to surfaces within a high-aspect ratio trench. FIG. 6A additionally illustrates how by imaging the secondary synthesized nanoparticles 120, it can be seen that the high-aspect ratio trenches are under-etched. If the high-aspect ratio trenches were fully etched, the secondary synthesized nanoparticles 120 would not bind to the bottom of the high-aspect ratio trench, as the bottom of the high-aspect ratio trenches would comprise the first material of the substrate 102. During a scan of the structures of FIG. 6A, it would be revealed that the entirety of the high-aspect ratio trench has a layer of synthesized nanoparticles over the surface. Since the organic molecules functionalize the synthesized nanoparticles to be selectively bonded, a computer program or individual, would recognize that the bottom of the high-aspect ratio trench is not made of the desired substrate 102 material.

FIG. 6B illustrates an exemplary semiconductor high-aspect ratio trench structure, which has been over etched in a previous process. This exemplary semiconductor structure is an over etched trench structure 600b. This over etched trench structure 600b is known to be over etched by the fact that the bottom of the high-aspect ratio trench is below the plane made by the top surface of the substrate 102. FIG. 6B illustrates that the synthesized nanoparticles 110 are bonded to the first material of the substrate 102. The synthesized nanoparticles 110 reveal that the high-aspect ratio trenches have been over-etched during scanning, as the synthesized nanoparticles 110 bond exclusively to the first material of the substrate 102. The synthesized nanoparticles 110 will bind to the lower portion of the sides of the high-aspect ratio trench due to the over etching. During imaging of the synthesized nanoparticles 110, this over etch will be seen since the synthesized nanoparticles 110 are meant to bind exclusively to the first material of the substrate 102.

The deposition of synthesized nanoparticles on and within a semiconductor structure such as high-aspect ratio trenches, enables for more efficient imaging of the semiconductor structure. The synthesized nanoparticles and the nano-layer formed by the synthesized nanoparticles forms an imaging layer or marker layer. This imaging or marker layer may be detected so that over-etching or improper-etch can be detected. Multiple imaging or marker layers can be utilized with the deposition of secondary synthesized nanoparticles or yet other sets of secondary synthesized nanoparticles. These imaging and marker layers enable for fast scans of the wafer for the detection of improper etching or deposition. This method may also be useful for improving the contrast when two similar semiconductor materials are imaged. X-Ray imaging may be utilized to image deep into the high-aspect ratio trenches.

In some embodiments of the present disclosure, the synthesized nanoparticles are removed from the semiconductor structure after determining whether the structure is improperly etched or deposited. The synthesized nanoparticles may be removed using a suitable etch process, or may be removed by immersing the semiconductor structures into a solution which breaks the bonds between the synthesized nanoparticles and the semiconductor structure materials.

While the foregoing is directed to embodiments of the present disclosure, other and further embodiments of the disclosure may be devised without departing from the basic scope thereof, and the scope thereof is determined by the claims that follow.

What is claimed is:

1. A method for depositing a layer of nanoparticles or a nano-layer to a semiconductor device, comprising:
    modifying synthesized nanoparticles with an organic molecule, the organic molecule comprising:
        a head group that binds to a surface of the synthesized nanoparticle; and
        a tail group; and
    depositing the synthesized nanoparticles onto at least part of a semiconductor structure, wherein the tail group binds the synthesized nanoparticles to at least part of the semiconductor structure and forms a nano-layer.

2. The method of claim 1, wherein the at least part of the semiconductor structure comprises a high-aspect ratio trench.

3. The method of claim 2, wherein the high-aspect ratio trench comprises a trench with a depth and a width and a ratio of the depth to the width is greater than about 10:1.

4. The method of claim 3, wherein the synthesized nanoparticles have a diameter that is smaller than the width of the trench.

5. The method of claim 1, wherein the synthesized nanoparticles have a diameter of less than about 5 nm.

6. The method of claim 1, wherein the synthesized nanoparticle comprises an element with an atomic number greater than 25.

7. The method of claim 1, wherein the synthesized nanoparticle comprises at least one fluorescent marker.

8. The method of claim 1, wherein the synthesized nanoparticles comprise one of silver or gold.

9. A method for depositing a nano-layer in a semiconductor device, comprising:
    modifying synthesized nanoparticles with an organic molecule, the organic molecule comprising:
        a head group that binds to a surface of the synthesized nanoparticle; and
        a tail group; and
    depositing the synthesized nanoparticles into at least part of a high-aspect ratio trench structure, wherein a surface of the high-aspect ratio trench structure comprises hydrogen oxide molecules, and wherein the tail group binds the synthesized nanoparticles to at least part of the high-aspect ratio trench structure.

10. The method of claim 9, wherein the high-aspect ratio trench comprises a trench structure with a depth and a width and a ratio of the depth to the width is greater than about 10:1.

11. The method of claim 10, wherein the synthesized nanoparticles have a diameter that is smaller than the width of the trench.

12. The method of claim 9, wherein the synthesized nanoparticle comprises an element with an atomic number greater than 25.

13. The method of claim 9, wherein the synthesized nanoparticle comprises at least one florescent marker.

14. The method of claim 9, wherein the high-aspect ratio trench structure comprises a trench with two or more surface materials.

15. The method of claim 14, wherein the synthesized nanoparticles bind to only a first material of the two or more surface materials.

16. The method of claim 15, wherein a second synthesized nanoparticle is deposited onto and binds to a second material of the two or more surface materials.

17. The method of claim 16, wherein the first material is an oxide material and the second material is a metal material.

18. A semiconductor device, comprising:
    a high-aspect ratio trench having a depth and a width, a ratio of the depth to the width being greater than about 10:1;

a nano-layer disposed in at least a portion of the high-aspect ratio trench, the nano-layer comprising synthesized nanoparticles, the synthesized nanoparticles comprising an element with an atomic number greater than 40; and an organic molecule, the organic molecule bonded to the high-aspect ratio trench via a tail group and the synthesized nanoparticle via a head group.

19. The device of claim 18, wherein the head group comprises one of SH, $NH_2$, $PO(OH)_2$, $SiCl_3$, and COOH and the tail group comprises on of $Si(OCH_3)_3$, $Si(OC_2H_5)_3$, COOH, and $CH_3$.

20. The device of claim 19, wherein the synthesized nanoparticles comprise one of gold, silver, copper, or nonmetals with an atomic number greater than 25.

* * * * *